United States Patent
Ono et al.

(10) Patent No.: US 7,649,259 B2
(45) Date of Patent: Jan. 19, 2010

(54) SEMICONDUCTOR DEVICE INCLUDING A PLURALITY OF WIRING LINES

(75) Inventors: Mizuki Ono, Yokohama (JP); Yuichi Motoi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 222 days.

(21) Appl. No.: 11/316,887

(22) Filed: Dec. 27, 2005

(65) Prior Publication Data

US 2006/0289996 A1    Dec. 28, 2006

(30) Foreign Application Priority Data

Jun. 24, 2005    (JP)    ............................. 2005-185105

(51) Int. Cl.
*H01L 23/52* (2006.01)

(52) U.S. Cl. .......... 257/758; 257/E29.17; 257/E21.645; 257/E21.694; 257/68; 257/71; 257/296; 257/309; 257/905; 257/908; 257/E27.098; 257/E27.077; 257/225; 257/234; 257/390; 257/E27.076

(58) Field of Classification Search ......... 257/314–326, 257/E29.17, E21.645, E21.694, 68, 309, 257/71, 296, 905, 225, 234, 390, E27.076, 257/E27.077, E27.098, 758
See application file for complete search history.

(56) References Cited

U.S. PATENT DOCUMENTS

| | | | |
|---|---|---|---|
| 5,580,809 A * | 12/1996 | Mori et al. .................. | 438/275 |
| 6,574,130 B2 | 6/2003 | Segal et al. | |
| 6,643,165 B2 | 11/2003 | Segal et al. | |
| 6,706,402 B2 * | 3/2004 | Rueckes et al. ............. | 428/408 |
| 6,784,028 B2 | 8/2004 | Rueckes et al. | |
| 7,348,870 B2 * | 3/2008 | Hsu et al. ..................... | 335/78 |
| 2002/0114191 A1 * | 8/2002 | Iwata et al. ............ | 365/185.23 |
| 2004/0085805 A1 | 5/2004 | Segal et al. | |
| 2005/0018478 A1 * | 1/2005 | Nagase et al. ............... | 365/171 |
| 2005/0056837 A1 * | 3/2005 | Ohtani et al. ................. | 257/57 |

FOREIGN PATENT DOCUMENTS

JP    2004-193282    7/2004

OTHER PUBLICATIONS

Lide, et al., "Electron Work Functions of the Elements", CRC Handbook of Chemistry and Physics, 75th Edition, CRC Press, pp. 12-112 through 12-115, (1994).
Saito, et al., "Electronic structure of double-layer graphene tubules", Journal of Applied Physics, vol. 73, No. 2, pp. 494-500, (Jan. 15, 1993).
Appenzeller, et al., "Short-channel like effects in Schottky barrier carbon nanotube field-effect transistor", Tech. Dig. of IEDM, pp. 285-288, (2002).
Y. Saito, et al., "Fundamentals of Carbon Nanotubes", Korona Publishing Co., Ltd., pp. 25-33, (1998).

* cited by examiner

*Primary Examiner*—Wael Fahmy
*Assistant Examiner*—Marc Armand
(74) *Attorney, Agent, or Firm*—Finnegan, Henderson, Farabow, Garrett & Dunner, L.L.P.

(57) ABSTRACT

A semiconductor device includes a first wiring line group made of a metal, wiring lines of the first wiring line group being arranged in parallel with each other, a second wiring line group which is made of a semiconductor and crosses the first wiring line group, wiring lines of the second wiring line group being arranged in parallel with each other and being movable in the vicinity of each intersection with the wiring lines of the first wiring line group, and a plurality of metal regions which are formed to be joined with the wiring lines constituting the second wiring line group, and have a work function different from that of the metal forming the first wiring line group.

14 Claims, 12 Drawing Sheets

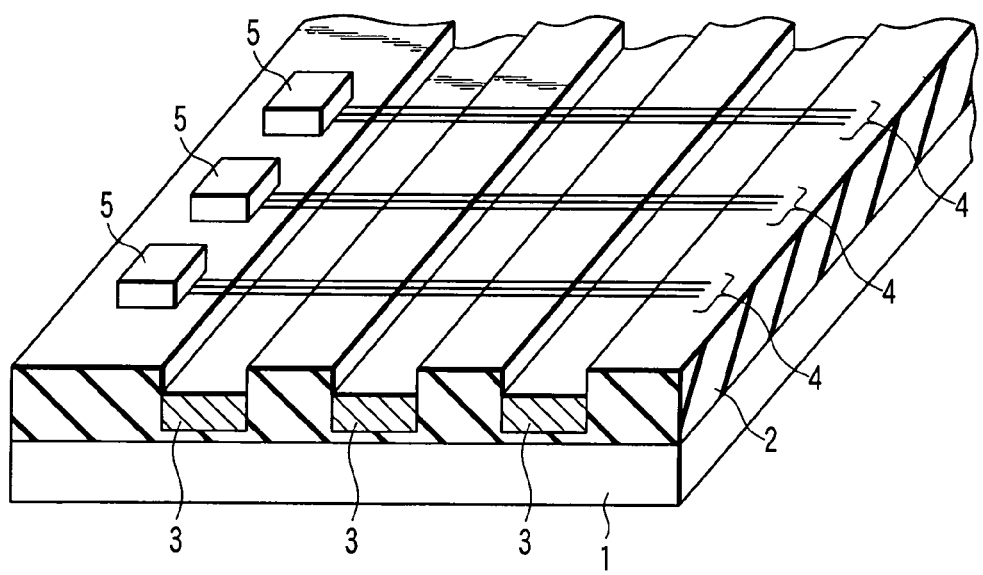
FIG. 3
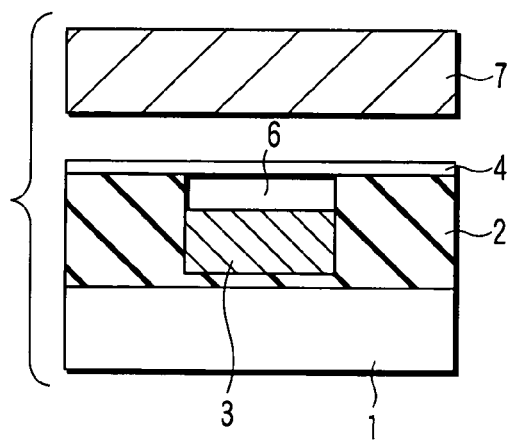 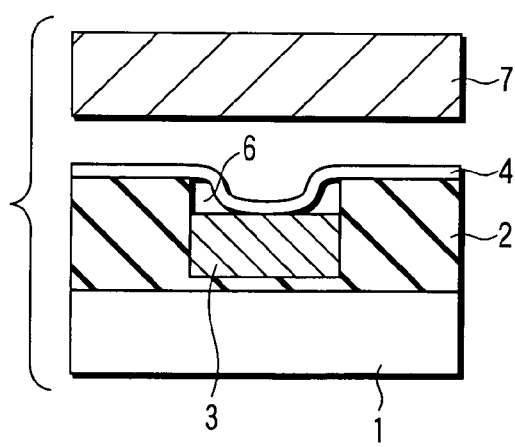
FIG. 4A  FIG. 4B

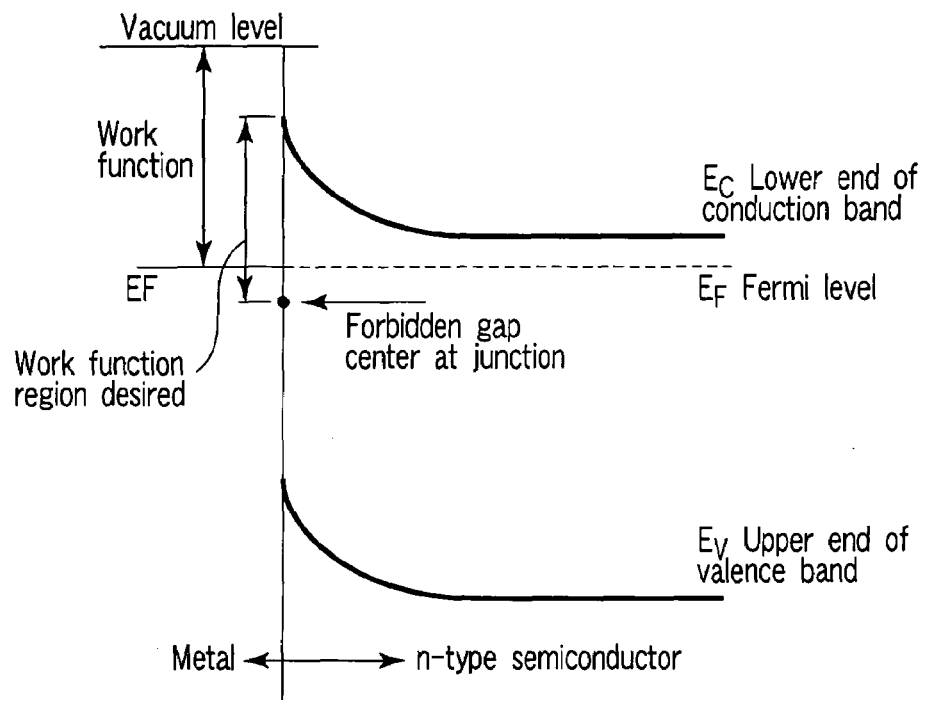
F I G. 5A
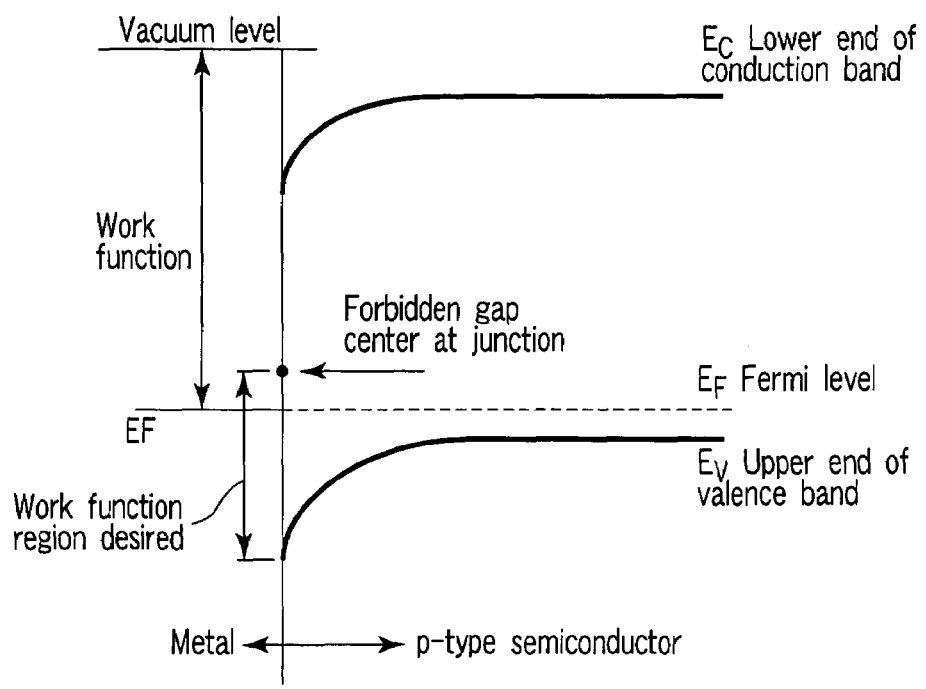
F I G. 5B

SEMICONDUCTOR DEVICE INCLUDING A PLURALITY OF WIRING LINES

CROSS-REFERENCE TO RELATED APPLICATIONS

This application is based upon and claims the benefit of priority from prior Japanese Patent Application No. 2005-185105, filed Jun. 24, 2005, the entire contents of which are incorporated herein by reference.

BACKGROUND OF THE INVENTION

1. Field of the Invention

The present invention relates to a semiconductor device including a non-volatile semiconductor memory device.

2. Description of the Related Art

As a non-volatile semiconductor memory device in which a cell is placed at each intersection of a word line and a bit line arranged to be substantially orthogonal to each other, and from which stored information is read based on whether a current is flowing through the cell, there is known, e. g., a scheme which uses a tunneling magnetoresistive (TMR) element for the cell (see Jpn. Pat. Appln. KOKAI Publication No. 2004-193282). In a semiconductor memory device adopting a scheme which reads stored information by detecting a current flowing through each cell like this reference, an element which stores information by a change in resistance of each cell, and an element having a rectifying function must be connected in series as illustrated in FIG. 1 of this reference.

The reason why each cell must be constituted by series connection of the memory element and the rectification element in this manner is as follows. FIG. 1 schematically shows a semiconductor memory device. Here, three word lines (indicated as WL in the drawing) and three bit lines (indicated as BL in the drawing) are illustrated. Each square (indicated as M) in the drawing represents a memory element, and each cell is constituted of this memory element M only. For example, a consideration will be given as to a case where a judgment is made upon whether a current flows through a cell (encircled by a dotted line in the drawing) provided at an intersection of the second word line (indicated as WL2 in the drawing) and the second bit line (indicated as BL2 in the drawing). Even if this cell is in a non-conductive state, since a current flows in a path indicated by, e.g., arrows of solid lines in the drawing when surrounding cells are in a conductive state, the cell in question is determined as being in the conductive state.

Conversely, when each cell is constituted by series connection of the memory element M (indicated by a square in the drawing) and the rectification element (indicated by a diode symbol in a circuit diagram in the drawing) as shown in FIG. 2, since a current does not flow in a direction indicated by an arrow of a broken line in the drawing, the current cannot flow in a path indicated by arrows of solid lines, the current does not flow through a path connecting the word line and the bit line to which a cell in question is connected when the cell in question is in a non-conductive state irrespective of whether surrounding cells are in a conductive state, and hence whether the cell in question is in the conducive state or in the non-conductive state can be accurately read.

For this reason, in the semiconductor memory device from which stored information is read by detecting a current flowing through each cell, each cell must be constituted by series connection of an element which stores information by a change in resistance and an element having a rectifying function. Therefore, the structure becomes complicated, which obstructs miniaturization, thereby hindering improvement in memory density.

Therefore, there has been demanded realization of a semiconductor device including a non-volatile semiconductor memory device with sufficiently high memory density in which a conductive state and a non-conductive state are switched and a configuration of each cell is simplified by providing a memory element having a rectifying function in the conducive state, thus enabling miniaturization of each cell.

BRIEF SUMMARY OF THE INVENTION

According to a first aspect of the invention, there is provided a semiconductor device, which comprises:

a first wiring line group including a plurality of first wiring lines, the first wiring lines being made of a metal and arranged in parallel with each other;

a second wiring line group including a plurality of second wiring lines, the second wiring lines being made of a semiconductor, crossing the first wiring line group, being arranged in parallel with each other and movable in the vicinity of each intersection with the first wiring lines of the first wiring line group; and a plurality of metal regions which are formed to be joined with the wiring lines constituting the second wiring line group, and have a work function different from that of the metal forming the first wiring line group.

According to a second aspect of the invention, there is provided a semiconductor device, which comprises:

a first wiring line group including a plurality of first wiring lines, the first wiring lines being made of a metal and arranged in parallel with each other; and a second wiring line group including a plurality of second wiring lines, the second wiring lines crossing the first wiring line group, being arranged in parallel with each other, each of the second wiring lines having a movable semiconductor region in the vicinity of each intersection with the first wiring lines of the first wiring line group and having a metal region with a work function different from that of the metal constituting the first wiring line group in an area other than the intersections.

According to a third aspect of the invention, there is provided a semiconductor device, which comprises:

a first wiring line group including a plurality of first wiring lines, the first wiring lines being made of a semiconductor and arranged in parallel with each other; and a second wiring line group including a plurality of second wiring lines, the second wiring lines crossing the first wiring line group and being arranged in parallel with each other, each of the second wiring lines being movable in the vicinity of each intersection with the first wiring group, and being formed of a metal having a work function larger than a difference between a lower end of a conduction band of the semiconductor at a junction face thereof and a vacuum level of an electron and smaller than a difference between an upper end of a valence band at the junction face and the vacuum level of the electron with respect to the semiconductor constituting the first wiring line group.

According to a fourth aspect of the invention, there is provided a semiconductor device, which comprises:

a first wiring line group including a plurality of first wiring lines, the first wiring lines being arranged in parallel with each other;

a second wiring line group including a plurality of second wiring lines, the second wiring lines crossing the first wiring line group and arranged in parallel with each other;

a first semiconductor region arranged at each intersection of the first wiring line group and the second wiring line group, and coupled with each of the first wiring lines and movable; and a second semiconductor region arranged at each intersection of the first wiring line group and the second wiring line group, coupled with each of the second wiring lines, and having a conductivity type opposite to that of the first semiconductor region.

BRIEF DESCRIPTION OF THE SEVERAL VIEWS OF THE DRAWING

FIG. 3 is a schematic perspective view illustrating a semiconductor memory device according to a first embodiment of the present invention;

FIGS. 4A and 4B are cross-sectional views illustrating an operation of the semiconductor memory device according to the first embodiment;

FIGS. 5A and 5B are views illustrating a relationship between a work function of a metal material and an energy level of a semiconductor material in the semiconductor memory device according to the embodiment of the present invention;

DETAILED DESCRIPTION OF THE INVENTION

Figure 1:
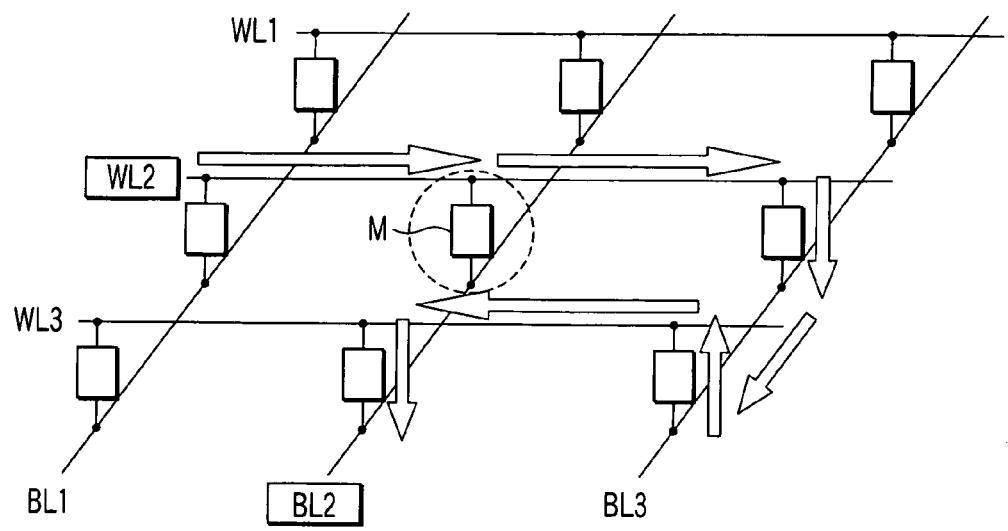
FIG. 1 is a schematic perspective view illustrating a problem in a conventional semiconductor memory device.
Figure 2:
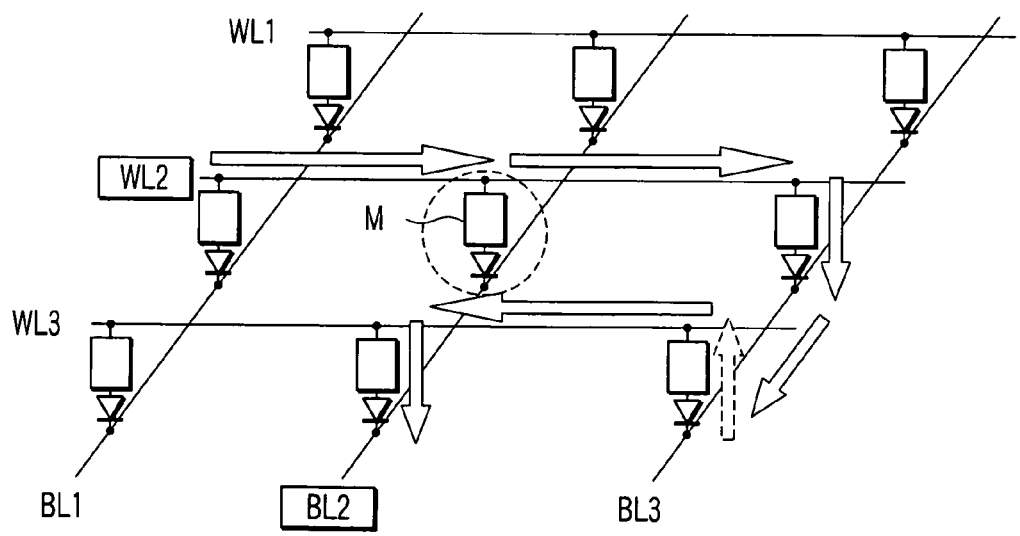
FIG. 2 is another schematic perspective view illustrating a problem in a conventional semiconductor memory device.

A semiconductor device according to an embodiment of the present invention which will now be described is an element in which a semiconductor line is movable at an intersection of each word line and each bit line one of which is formed of a metal and the other of which is formed of a semiconductor and a conductive state and a non-conductive state are switched depending on whether a movable region of the semiconductor line is in contact with one of the word line and the bit line. A metallic line in anyone of the word line and the bit line and an electrode portion to which the other line of them is connected are formed of metals having different work functions.

With such a configuration, in the conducive state, a junction of the word line and the bit line can be determined as a Schottky connection, and a junction of the semiconductor line which is one of the word line and the bit line and an electrode can be substantially determined as an ohmic connection. In this way, the ohmic connection does not show rectification characteristics and a current which is approximately in proportion to a voltage flows, whereas the Schottky connection shows rectification characteristics. Therefore, an element which is equivalent to series connection of an element which stores information and a rectification element can be realized by an element alone which stores information by switching between a conductive state and a non-conductive state.

Another semiconductor device according to the embodiment of the present invention is an element in which a metallic line is movable at an intersection of each word line and each bit line, one of which is formed of metal and the other one of which is formed of a semiconductor, and a conductive state and a non-conductive state are switched based on whether a movable region of the metallic line is in contact with the line formed of the semiconductor. Of the word line and the bit line, the line formed of the metal is formed by using a metal having a Fermi level in a forbidden gap of the line formed of the semiconductor.

With such a configuration, in the conductive state, a junction of the word line and the bit line is realized as a Schottky connection. Therefore, with this configuration, an element which is equivalent to series connection of an element which stores information and a rectification element can be realized by an element alone which stores information by switching between the conductive state and the non-conductive state.

Still another semiconductor device according to the embodiment of the present invention is an element in which a movable semiconductor region connected with each word line and each bit line is provided at an intersection of each word line and a bit line and a conductive state and a non-conductive state are switched based on whether the semiconductor region electrically couples the word line and the bit line with each other, and two semiconductor regions are formed as opposite conductivity types.

With such a configuration, a pn junction is formed between the word line and the bit line in the conductive state. Since the pn junction shows rectification characteristics, an element which is equivalent to series connection of an element which stores information and a rectification element is realized by an element alone which stores information by switching of the conductive state and the non-conductive state.

Embodiments of the present invention will now be described hereinafter with reference to the accompanying drawings. Further, the present invention is not restricted to the following embodiments, and can be modified and used in many ways.

FIRST EMBODIMENT

FIG. 3 shows a schematic perspective view of a semiconductor (memory) device according to an embodiment of the present invention, and FIGS. 4A and 4B show a principle of operation. This semiconductor device includes a word line and a bit line, and they are formed of a wiring line group 3 constituted of metals and a wiring line group 4 constituted of a semiconductor. Anyone of the word line and the bit line may be a semiconductor. Furthermore, each wiring line in the wiring line group 4 is movable at each intersection of the semiconductor wiring line group 4 and the metal wiring line group 3, and a work function of each metal region (a pad) 5 connecting the semiconductor wiring line group 4 with an external wiring line is configured to be different from a work function of a metal forming the metal wiring line group 3.

In general, the difference between the Fermi level of a metal and the energy level of the outside of the metal (the energy level of the outside is referred to as the vacuum level of an electron) is called the work function of this metal, and hence it can be said that both metals have different Fermi levels in the semiconductor memory device according to the embodiment of the present invention. In general, at a junction of a metal and a semiconductor, when a Fermi level of the metal is within a forbidden gap of the semiconductor, i.e., when the work function of the metal is larger than the difference between the lower end of a conductor band of the semiconductor and the vacuum level of an electron and smaller than the difference between the upper end of a valence band of the semiconductor and the vacuum level of the electron as shown in FIGS. 5A and 5B, this junction becomes a Schottky junction and shows rectification characteristics. That is, current-voltage characteristics are dependent on the polarity of the voltage. It is to be noted that the lower end of the conduction band and the upper end of the valence band are values at a junction face of the metal and the semiconductor.

As the Fermi level of the metal approximates the lower end of the conduction band of the semiconductor in a case where a majority carrier of the semiconductor is an electron, and as the Fermi level of the metal approximates the upper end of the valence band of the semiconductor in a case where the majority carrier of the semiconductor is a hole, dependence of the current-voltage characteristics on the polarity of the voltage is weakened, thus approximating the ohmic junction. That is, irrespective of a polarity of the voltage, a nearly equal current flows.

At each intersection of the wiring line forming the wiring line group 3 and the wiring line forming the wiring line group 4, the semiconductor forming the wiring line group 4 has bistability by a sum of an elastic energy involved by deformation of itself and an interaction energy based on an interatomic force between itself and the wiring line group 3. FIGS. 4A and 4B show cross-sectional views of one cell. The wiring line forming the wiring line group 4 is not in contact with the wiring line forming the wiring line group 3 and a non-conductive state is established between these lines in FIG. 4A, and these wiring lines are in contact with each other and a conductive state is achieved between them in FIG. 4B.

In the semiconductor memory device according to this embodiment, the metal forming the wiring line group 3 and the metal forming each metal region 5 which connects the wiring line group 4 with an external wiring line are constituted of metals having different work functions. As a result, in regard to junctions of these metals and the wiring line forming the wiring line group 4, one (the intersection) notably shows rectification characteristics, and the other one (the pad portion) does not substantially show the rectification characteristics. Therefore, the conductive state and the non-conductive state are switched at each intersection of the two wiring line groups, and the rectification characteristics are shown in the conductive state. As a result, just arranging the element which is switched between the conductive state and the non-conductive state at each intersection of the two wiring line groups is equivalent to a configuration in which a switch element and a rectification element are connected in series at this intersection. Therefore, the non-volatile semiconductor memory device which stores information based on the conductive state or the non-conductive state can be very simply realized as compared with the prior art.

It is to be noted that a value of the current in a forward direction of the rectification element is reduced as the Fermi level is distanced from the lower end of the conduction band of the semiconductor in a case where the majority carrier of the semiconductor is an electron and from the upper end of the valence band of the semiconductor in a case where the majority carrier of the semiconductor is a hole. Therefore, in order to realize a large current in the forward direction, it is preferable for the Fermi level of the metal to be closer to the lower end of the conduction band of the semiconductor when the majority carrier of the semiconductor is the electron and to the upper end of the valence band of the semiconductor when the majority carrier of the semiconductor is the hole.

That is, it is preferable for a work function of the metal to be smaller than a difference between a forbidden gap center of the semiconductor and a vacuum level of the electron when the majority carrier of the semiconductor is the electron and larger than the difference between the forbidden gap center of the semiconductor and the vacuum level of the electron when the majority carrier of the semiconductor is the hole.

It is to be noted that the junction becomes an ideal ohmic junction which does not show the rectification characteristics at all when the Fermi level of the metal does not fall within the forbidden gap of the semiconductor, i.e., when the Fermi level of the metal is above the lower end of the conduction band of the semiconductor in a case where the majority carrier of the semiconductor is the electron and below the upper end of the valence band of the semiconductor in a case where the majority carrier of the semiconductor is the hole.

That is, the junction becomes the ideal ohmic junction which does not show the rectification characteristics at all when the work function of the metal is smaller than a difference between the lower end of the conduction band of the semiconductor and the vacuum level of the electron in a case where the majority carrier of the semiconductor is the electron and larger than a difference between the upper end of the valence band of the semiconductor and the vacuum level of the electron in a case where the majority carrier of the semiconductor is the hole.

Therefore, in regard to Fermi levels of the metals which forms the metal region 5 which connects the wiring line group 4 formed of the semiconductor with the external wiring line and the wiring line group 3 constituted of the metal, one (the intersection) must be fall within the forbidden gap of the semiconductor 4 in order to determine the junction of itself and the semiconductor 4 forming the wiring line group 4 as the Schottky junction, but it is preferable for the other one (the pad portion) to be out of the forbidden gap of the semiconductor 4 in order to increase current in the conducive state, thereby heightening a read speed.

That is, it is preferable that one of the work functions of both the metals is larger than a difference between the lower end of the conduction band of the semiconductor and the vacuum level of the electron when the majority carrier of the semiconductor is the electron and a difference between the upper end of the valence band of the semiconductor and the vacuum level of the electron when the majority carrier of the semiconductor is the hole, and the other one is smaller than these differences.

Incidentally, although it is self-evident, in regard to the metals used in the above example, a "work function region desired" for showing the Schottky junction is illustrated in each of FIGS. 5A and 5B.

Moreover, in this semiconductor memory device, an insulator layer 2 of, e.g., silicon oxide is formed on a semiconductor substrate 1, and each wiring line 3 made of a metal is formed to be embedded in the insulator layer 2. Each wiring line 4 made of a semiconductor is formed on the metal wiring line 3 through a gap 6. Additionally, the semiconductor wiring line 4 is connected with the metal region 5 which serves as a junction portion with an external wiring line. It is to be noted that an interlayer insulating film, an external wiring line and others are eliminated in FIGS. 3, 4A and 4B. Further, an upper electrode is eliminated in FIG. 3.

Switching between the conductive state and the non-conductive state in this semiconductor memory device is carried out in the following manner. Switching from the non-conductive state to the conductive state is effected by applying a voltage between the word line and the bit line (i.e., the wiring lines 3 and 4) connected with a cell (an intersection of the wiring lines 3 and 4) where switching is performed. Then, electric charges having signs opposite to each other are induced in the metal forming the wiring line 3 and the semiconductor forming the wiring line 4, both the wiring lines pull each other by an electrostatic attraction of these electric charges, and the non-conductive state shown in FIG. 4A is switched to the conductive state depicted in FIG. 4B.

Switching from the conductive state to the non-conductive state is carried out by applying a voltage between the wiring line 4 connected with a cell where this switching is performed and an upper electrode 7 (not shown in FIG. 3). Then, electric charges having signs opposite to each other are induced in the semiconductor forming the wiring line 4 and the upper electrode 7, the semiconductor forming the wiring line 4 and the upper electrode 7 pull each other by an electrostatic attraction of these electric charges, and the conductive state shown in FIG. 4B is switched to the non-conductive state depicted in FIG. 4A.

Figure 6:
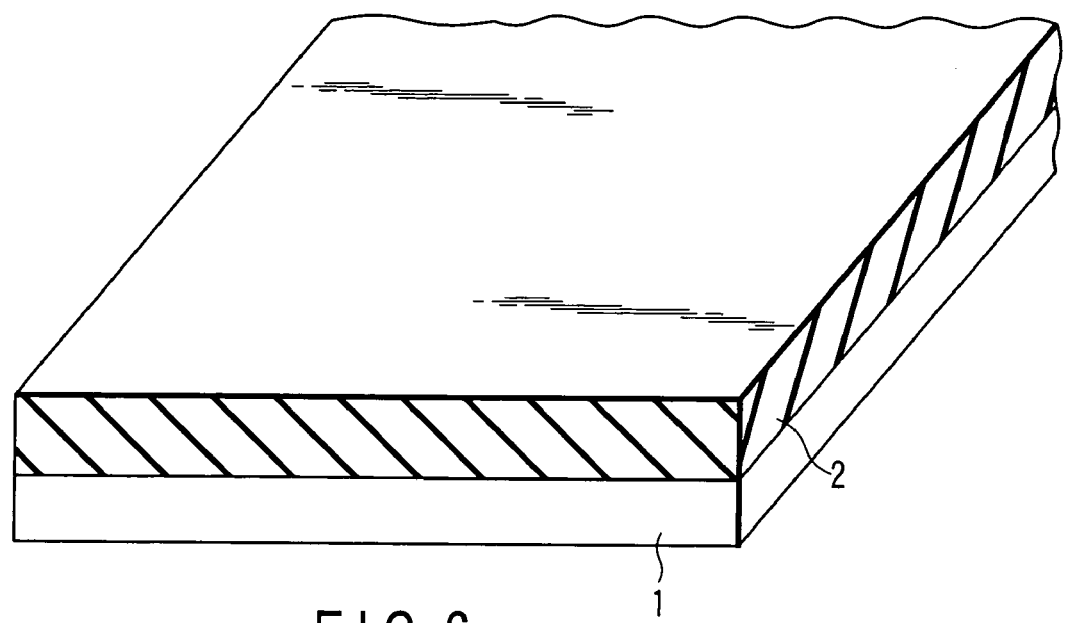
FIGS. 6 to 15 are schematic perspective views illustrating manufacturing steps of the semiconductor memory device according to the first embodiment of the present invention in stages.

A manufacturing method of this non-volatile semiconductor memory device will now be described. First, as shown in FIG. 6, a silicon oxide film 2 having a thickness of, e.g., 100 nm is formed on the semiconductor substrate 1 by a method such as chemical vapor deposition (CVD).

Figure 7:
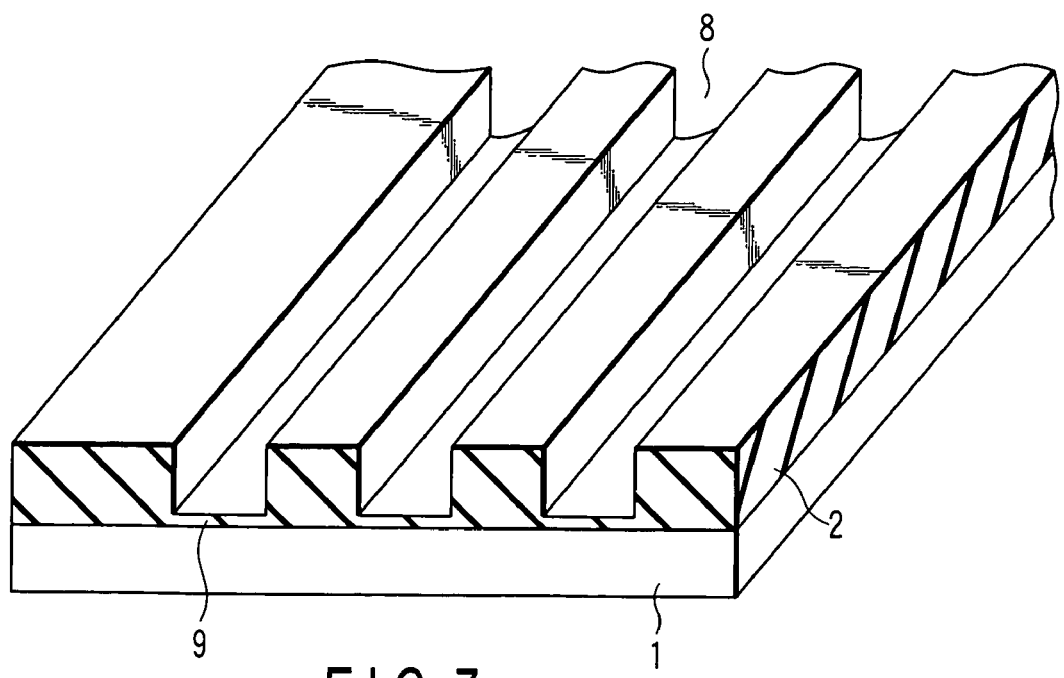

Then, as shown in FIG. 7, each groove portion 8 is formed on the silicon oxide film 2 by a method such as reactive ion etching (RIE). When the groove portion 8 pierces the silicon oxide film 2, a silicon oxide film 9 is formed on a bottom portion of the groove portion 8 by, e.g., a method of exposing the semiconductor substrate 1 to an oxygen atmosphere in a temperature-up state.

Figure 8:
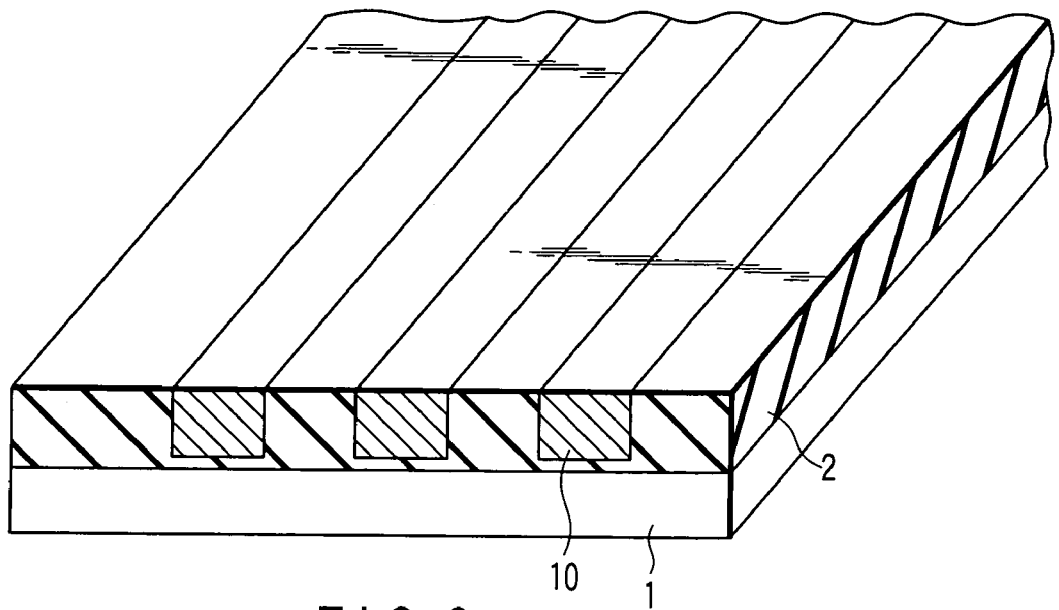

Subsequently, as shown in FIG. 8, a tungsten film 10 having a thickness of, e.g., 200 nm is formed on the entire surface of the semiconductor substrate by a method such as CVD. Then, a surface of the tungsten film 10 is flattened by a method such as chemical mechanical polishing (CMP) so that a surface of the silicon oxide film 2 is exposed.

Figure 9:
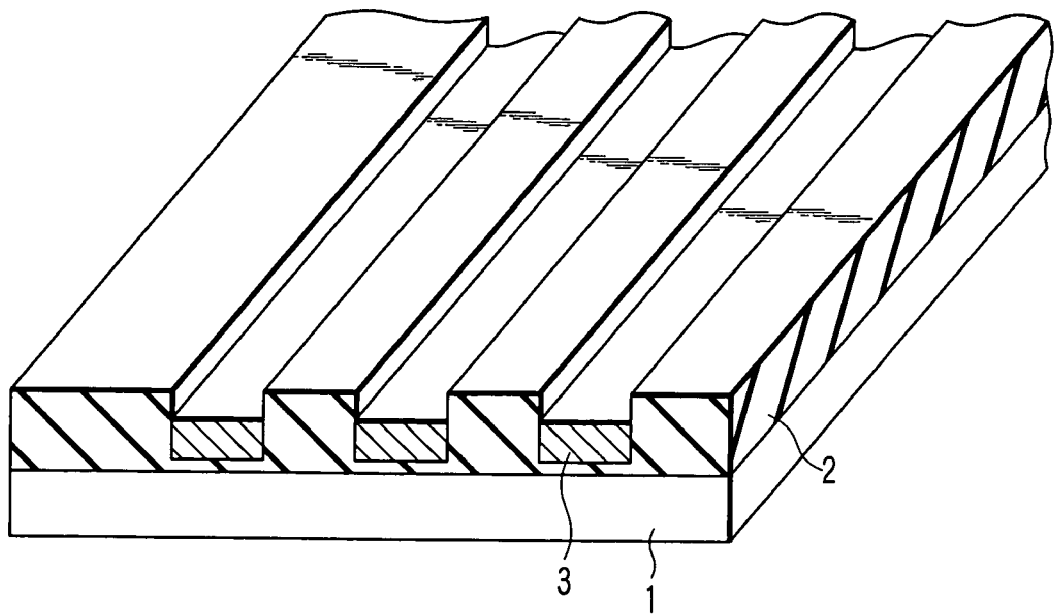

Next, as shown in FIG. 9, the surface of the tungsten film 10 is etched by an amount corresponding to, e.g., 10 nm by a method such as RIE to form the wiring line group 3.

Figure 10:
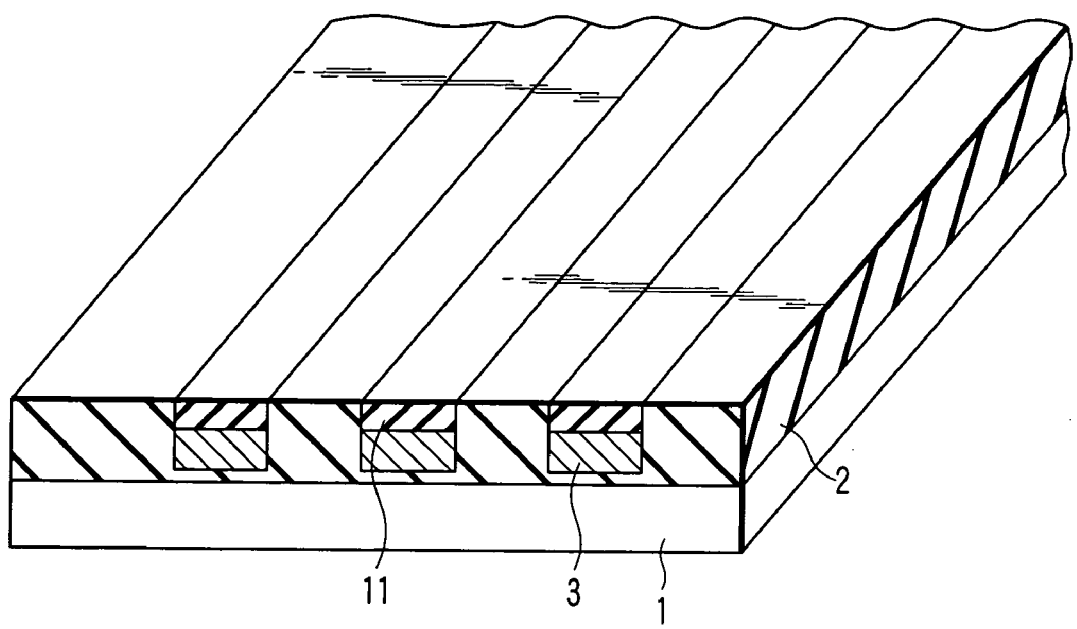

Then, as shown in FIG. 10, a silicon nitride film 11 having a thickness of, e.g., 20 nm is deposited by a method such as CVD. Subsequently, a surface is flattened by using a method such as CMP to expose the surface of the silicon oxide film 2, thereby forming the silicon nitride film 11 serving as a sacrificial layer.

Figure 11:
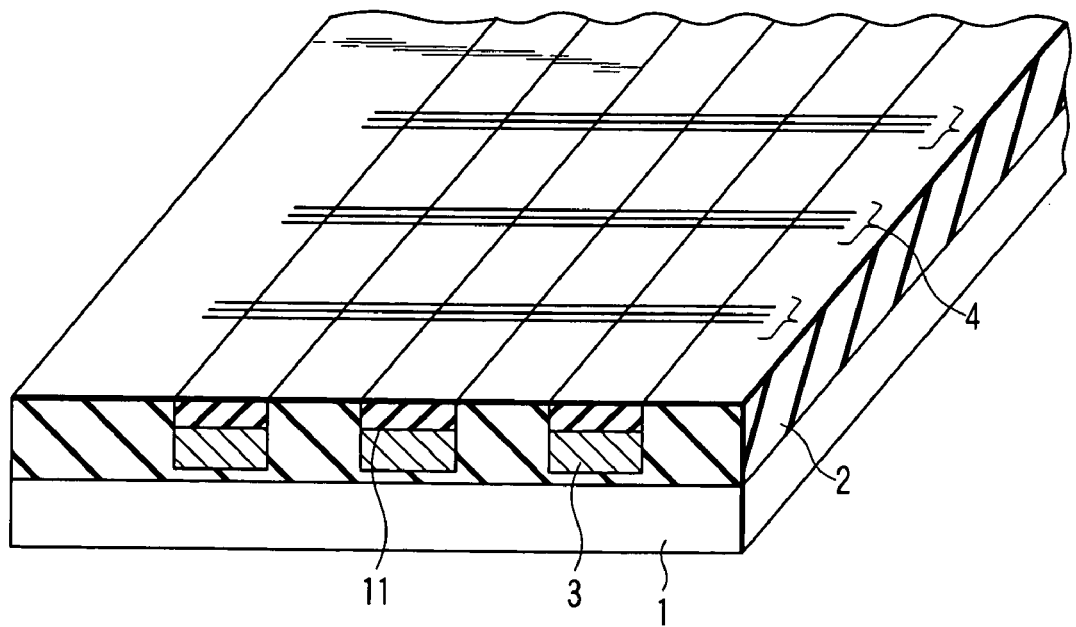

Then, as shown in FIG. 11, for example, a semiconductor carbon nanotube film is formed on the entire surface of the semiconductor substrate 1 by a method such as a spin coat method. Furthermore, a part of the carbon nanotube film is selectively removed to form the wiring line group 4.

Figure 12:
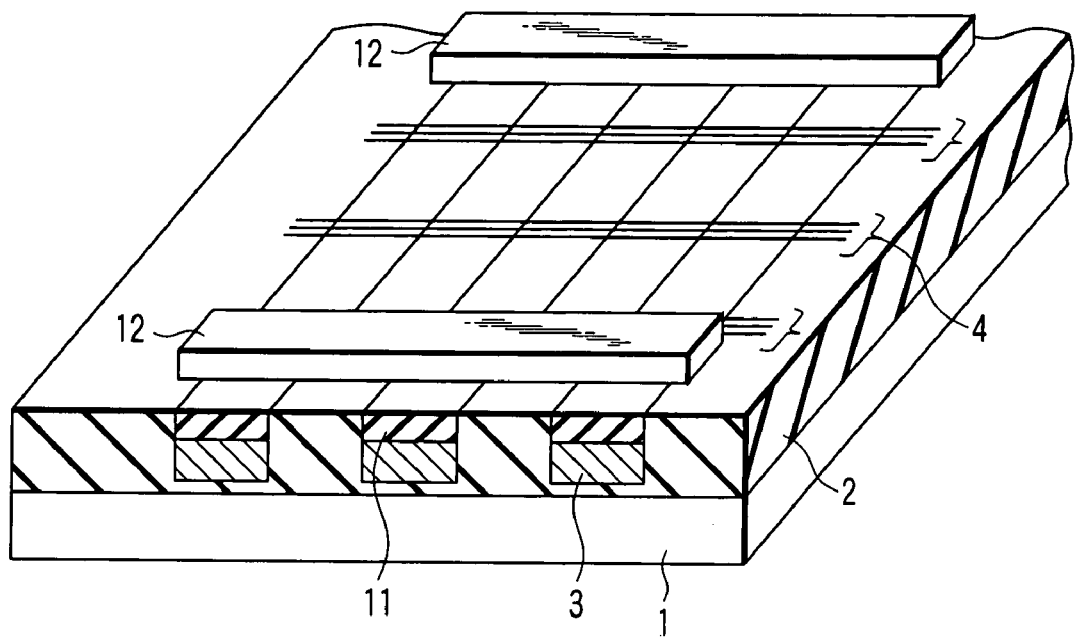

Then, as shown in FIG. 12, a tungsten film having a thickness of, e.g., 20 nm is formed on the entire surface of the semiconductor substrate by a method such as CVD. Subsequently, a part of the tungsten film is selectively removed by a method such as RIE to form a tungsten layer 12.

Figure 13:
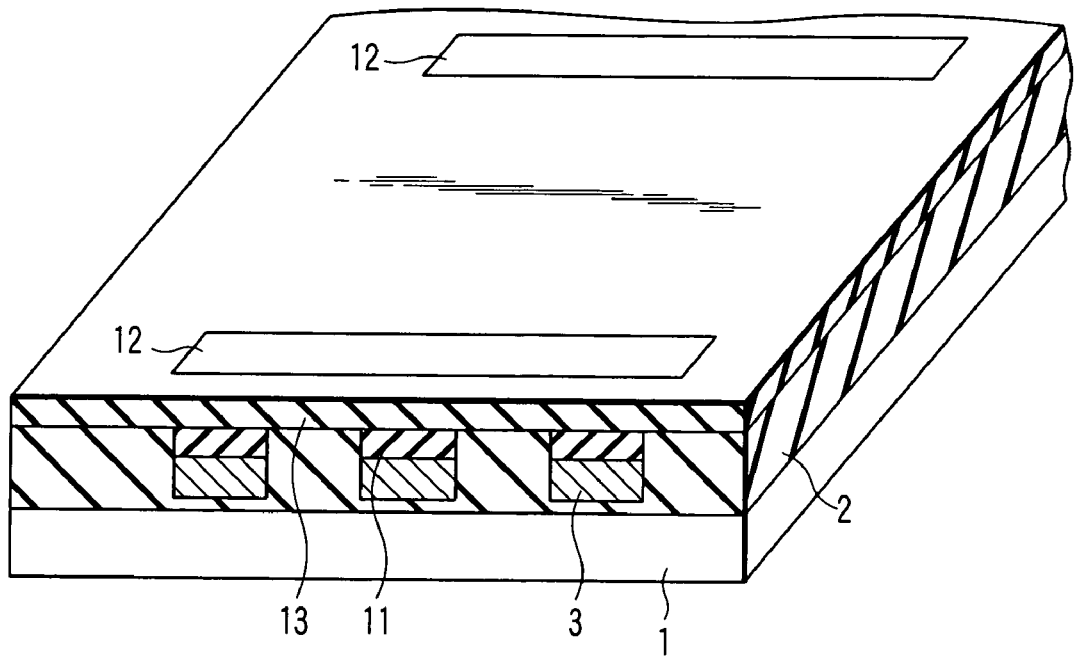

Next, as shown in FIG. 13, a silicon nitride film 13 having a thickness of, e.g., 50 nm is deposited by a method such as CVD. Subsequently, a surface is flattened by using a method such as CMP so that a surface of the tungsten layer 12 is exposed, thereby forming the silicon nitride film 13 serving as a sacrificial layer.

Figure 14:
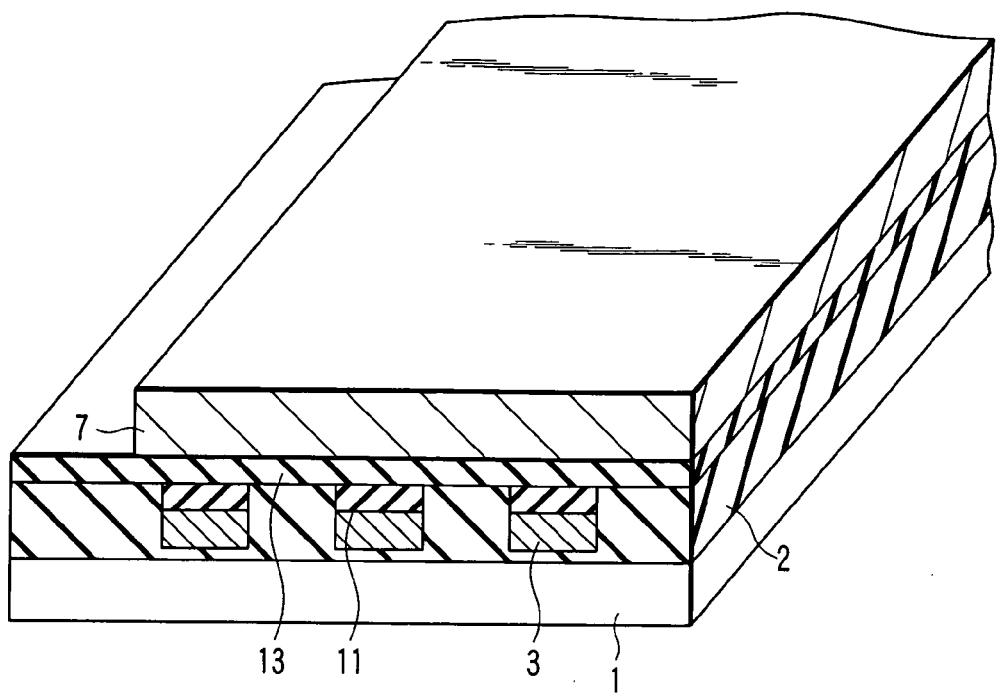

Then, as shown in FIG. 14, a tungsten film having a thickness of, e.g., 100 nm is formed on the entire surface of the semiconductor substrate by a method such as CVD. Subsequently, a part of the tungsten film is selectively removed by a method such as RIE to form the upper electrode 7.

Figure 15:
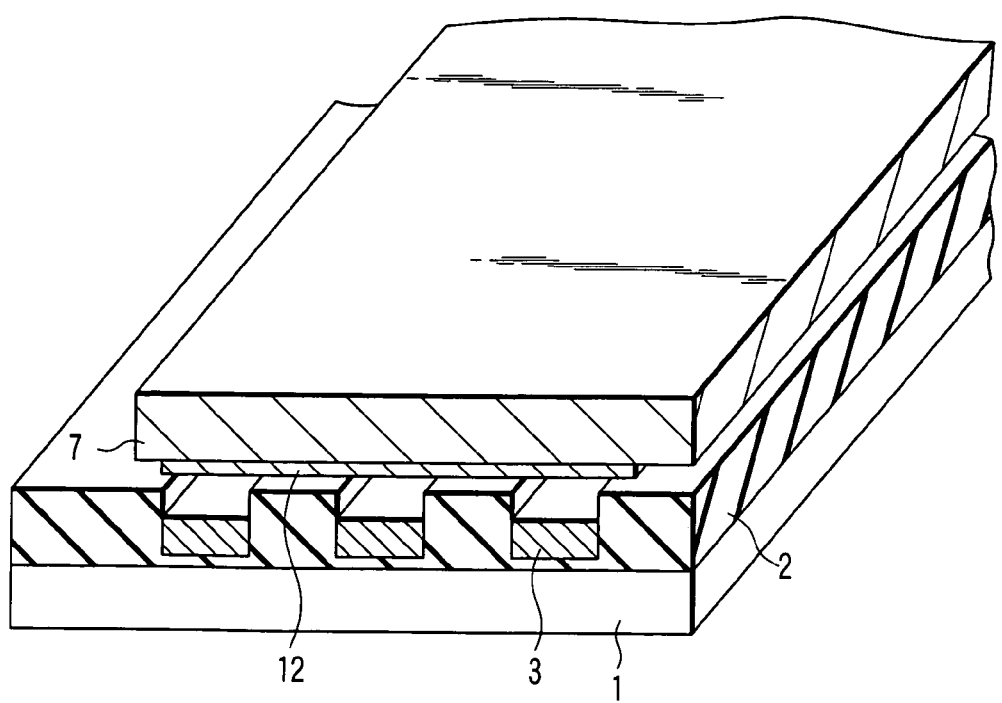

Next, as shown in FIG. 15, the silicon nitride film 11 and the silicon nitride film 13 are removed by a method such as wet processing.

Subsequently, for example, like a regular wiring line step, each junction portion 5 (shown in FIG. 1) of the wiring line group and an external wiring line is formed. Thereafter, like the prior art, the non-volatile semiconductor memory device according to this embodiment shown in FIG. 3 is formed through a known interlayer insulating film formation step or wiring line step (however, the upper electrode 7 is eliminated in FIG. 3).

Although the process of forming the non-volatile semiconductor memory device alone has been described in this embodiment, this process can be also used when forming a non-volatile semiconductor memory device as a part of a semiconductor device including an active element such as a field-effect transistor or a bipolar type transistor, a single-electron transistor, a diode, or a passive element such as a resistor, inductor or a capacitor, or an element using, e.g., a ferroelectric substance or a magnetic substance besides the non-volatile semiconductor memory device. This process can be also used when forming a non-volatile semiconductor memory device as a part of an opto-electrical integrated circuit (OEIC) or a microelectromechanical system (MEMS). It is needless to say that a peripheral circuit of the non-volatile semiconductor memory device can be included in a semiconductor device.

Moreover, although the description has been given as to the example where the non-volatile semiconductor memory device is formed on a bulk semiconductor substrate in this embodiment, this device can be likewise formed on a silicon-on-insulator (SOI) substrate and the same effects can be obtained. Additionally, although silicon oxide is used as the insulating film which separates the wiring lines constituting the wiring line group 3 from each other in this embodiment, the present invention is not restricted thereto, and it is possible to use silicon nitride, oxynitride silicon or the like. The silicon nitride film formed to constitute the sacrificial layer does not have to be the silicon nitride film, and it is possible to use silicon oxide, oxynitride silicon or the like.

Further, tungsten is used as a metal required to form the wiring line group 3, but this metal is not necessarily needed, and any other metal may be used. However, since tungsten has excellent heat resistant properties, a high-temperature step may be set after this step, and there is an advantage that a degree of freedom in configuring the forming step can be increased.

Furthermore, although the carbon nanotube is used as the semiconductor for forming the wiring line group 4 in this embodiment, this semiconductor is not necessarily required, and any other semiconductor such as silicon may be used. The physical properties of silicon are well known. Therefore, when an impurity is contained in at least a part of this semiconductor in order to reduce a resistance of the wiring line and thereby increase an operating speed, this can be advantageously facilitated. On the other hand, since the carbon nanotube has high mechanical strength, there is an advantage that it can be excellently used in a mechanical movable region like the semiconductor device according to the present invention.

Moreover, although the carbon nanotube used to form the wiring line group 4 is orientated in a direction substantially orthogonal to the wiring line group 3 in the drawing of this embodiment, this is not essential, and carbon nanotubes having various orientations may be mixed. However, when the carbon nanotube is orientated in the direction described in this embodiment, a resistance of the wiring line group 4 is reduced, and hence there is an advantage that the operating speed of the semiconductor memory device is increased.

Further, in regard to the carbon nanotube, there is a report that a barrier height of the Schottky barrier with respect to Ti when a majority carrier is a hole is approximately 0.3 eV (J. Appenzeller, J. Knoch, R. Martel, V. Derycke, S. Wind, Ph. Avouris "Short-channel effects in Schottky barrier carbon nanotube field-effect transistors," in Technical Digest of International Electron Device Meeting 2002, pp. 285-288). Furthermore, a work function value of Ti is approximately 4.3 eV ("Handbook of Chemistry and Physics" by D. R. Lide, 75th edition CRC Press 1995). As a result, it can be said that the difference between the upper end of a valence band of the carbon nanotube and the vacuum level of an electron is approximately 4.6 eV. Moreover, the forbidden gap width of the carbon nanotube is dependent on the diameter, the structure or the like of the tube, but it is typically approximately 0.5 eV (R. Saito, G. Dresselhaus, M. S. Dresselhaus, "Electronic structure of double-layer graphene tubules," in Journal of Applied Physics vol. 73, no. 2 (1993), pp. 494-500). As a result, it can be understood that the difference between the lower end of a conduction band of the carbon nanotube and the vacuum level of the electron is approximately 4.1 eV.

In view of these facts, a junction with a metal having a work function which is not greater than 4.1 eV becomes an ideal ohmic junction when a majority carrier of the carbon nanotube is an electron, and a junction with a metal having a work function which is not smaller than 4.6 eV becomes the ideal ohmic junction when the majority carrier of the carbon nanotube is a hole.

As described above, although the junction of the wiring line group 4 and the wiring line group 3 must be the Schottky junction, it is preferable for the junction of the wiring line group 4 and the metal region 5 to be the ohmic junction. Therefore, as a material forming the metal region 5, one of Ca, Ce, Cs, Eu, Gd, Hf, K, Li, Lu, Mg, Mn, Na, Nd, Rb, Sc, Sm, Sr, Tb, Th, Tl, U, Y and Zr is preferable when a majority carrier of the carbon nanotube is an electron, and one of Ag, Au, Be, Co, Cu, Fe, Ir, Mo, Ni, Os, Pd, Pt, Re, Rh, Ru, Sb, Ta, W and Zn is preferable when a majority carrier of the carbon nanotube is a hole ("Handbook of Chemistry and Physics" by D. R. Lide, 75th edition, CRC press, 1995).

Moreover, it is known that the carbon nanotube can be efficiently formed by using a catalytic agent of a specific metal ("Basic of Carbon Nanotubes" by Yohachi Saito and Toshiharu Bandou, Korona Publishing Co., Ltd., 1998). Therefore, different from this embodiment, the metal region 5 which serves as a junction portion of the wiring line group 4 and the external wiring line is formed after the step shown in FIG. 10, and the carbon nanotube is formed with the metal region 5 being used as a catalytic agent, which results in an advantage that the carbon nanotube can be efficiently formed.

In view of this fact, it is preferable for the metal region 5 which serves as the junction portion of the wiring line group 4 and the external wiring line to be formed of one of Ce, Gd, Lu, Nd, Tb and Y when a majority carrier of the carbon nanotube is an electron, and to be one of Co, Fe, Ni, Pd, Pt and Rh when the majority carrier of the carbon nanotube is a hole ("Basic of Carbon Nanotubes" by Yohachi Saito and Toshiharu Bandou, Korona Publishing Co., Ltd., 1998).

Additionally, although the wiring line group 4 is formed by using the carbon nanotube which is a semiconductor in this embodiment, the carbon nanotube can be either a semiconductor or a metal depending on the diameter or chirality (the direction of a six-membered ring of carbon forming a tube with respect to the tube) thereof. Although the carbon nanotube must be a semiconductor in order to form a Schottky junction in the vicinity of a region where a junction with the wiring line group 3 is formed, the carbon nanotube does not have to be a semiconductor in any other region, and there is an advantage that resistance is reduced to improve a read speed when the carbon nanotube is a metallic material. Therefore, it can be considered that the carbon nanotube is formed as a semiconductor in the vicinity of each intersection with the wiring line group 3 and as a metal in any other region by controlling the diameter or chirality of the carbon nanotube forming the wiring line group 4. Further, it can be considered that the vicinity of each intersection is formed by using a semiconductor such as a carbon nanotube and any other region is formed by using a metal.

With such a configuration, like this embodiment, a structure which is equivalent to series connection of a switch element and an element having a rectifying function can be realized by using an element alone which stores information based on switching between a conductive state and a non-conductive state. In addition to this, there is produced an advantage that high-speed operation of the semiconductor device is possible as a result of reducing the resistance of the wiring line group 4 to improve read speed.

In this case, in view of the fact that the forward current at the junction of the wiring line group 3 and the wiring line group 4 is increased, it is preferable for the work functions of the metal forming the wiring line group 3 and the metal region of the wiring line group 4 to be smaller than the difference between the forbidden gap center of the semiconductor region of the wiring line group 4 and the vacuum level of an electron when the majority carrier of the semiconductor region of the wiring line group 4 is the electron, and larger than the difference between the forbidden gap center of the semiconductor region of the wiring line group 4 and the vacuum level of the electron when the majority carrier of the semiconductor region of the wiring line group 4 is a hole.

Furthermore, in order to form a junction of the semiconductor region of the wiring line group 4 and a metal forming the wiring line group 3 as the Schottky junction and to form a junction of the semiconductor region of the wiring line group 4 and a metal region of the wiring line group 4 as the ohmic junction, it is preferable for the work function of the metal forming the wiring line group 3 to be larger than the difference between the lower end of the conduction band of the semiconductor region of the wiring line group 4 and the vacuum level of an electron, and the work function of the metal region of the wiring line group 4 to be smaller than the above difference when the majority carrier of the semiconductor region of the wiring line group 4 is an electron. Moreover, when the majority carrier of the semiconductor region of the wiring line group 4 is a hole, it is preferable for the work function of the metal forming the wiring group 3 to be smaller than the difference between the upper end of a valence band of the semiconductor region of the wiring line group 4 and the vacuum level of the electron, and the work function of the metal region of the wiring group 4 to be larger than the above difference.

Therefore, as the metal forming the metal region of the wiring line group 4, one of Ca, Ce, Cs, Eu, Gd, Hf, K, Li, Lu, Mg, Mn, Na, Nd, Rb, Sc, Sm, Sr, Tb, Th, Tl, U, Y and Zr is preferable when a majority carrier of the semiconductor region of the wiring group line 4 is an electron, and one of Ag, Au, Be, Co, Cu, Fe, Ir, Mo, Ni, Os, Pd, Pt, Re, Rh, Ru, Sb, Ta, W and Zn is preferable when the majority carrier of the wiring line group 4 is a hole.

Figure 16:
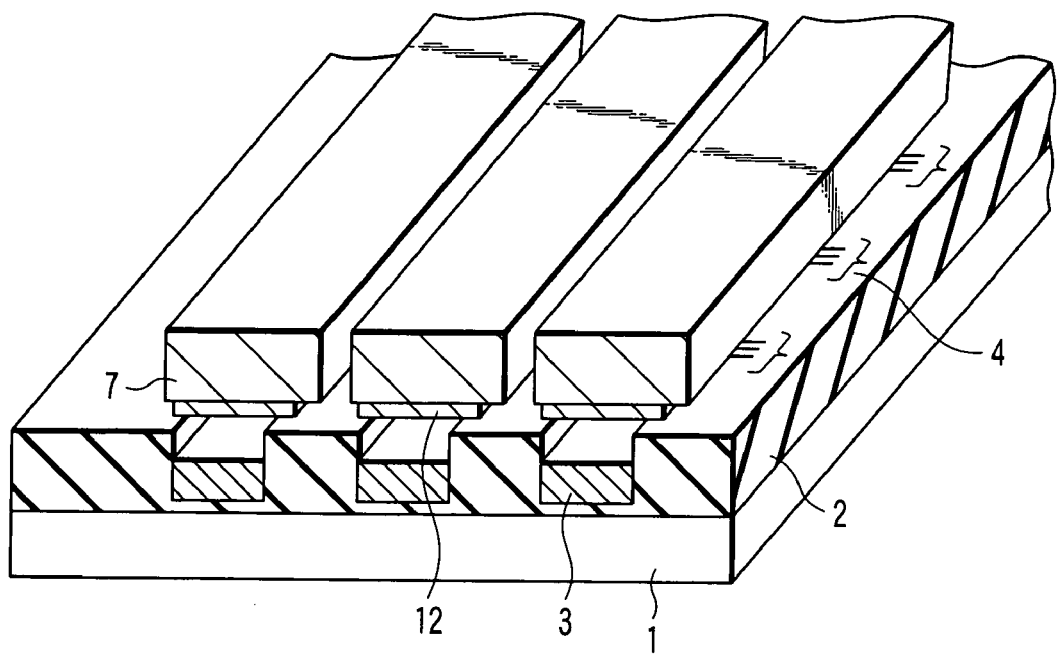
FIG. 16 is a schematic perspective view of a modification of the first embodiment.

Additionally, although the upper electrode 7 is integrally formed to cover all of the wiring line group 3 and the wiring line group 4 in this embodiment, it may be divided into a plurality of pieces as shown in FIG. 16, for example. In particular, when the upper electrode is divided in accordance with wiring lines forming the wiring line group 3 as shown in FIG. 16, there is an advantage that a specific cell alone can be switched from the conductive state to the non-conductive state without switching the conductive state and the non-conductive state of any other cell. On the other hand, when the upper electrode is integrally formed like this embodiment, there is another advantage that the circuit configuration can be simplified.

Further, although the metal region 5 is formed at each junction portion of the wiring line group 4 and the external wiring line, the wiring line group 4 may be directly joined with the external wiring line without forming such a metal region 5. When such a configuration is adopted, there is an advantage that the manufacturing process can be simplified. On the other hand, when the metal region 5 is formed like this embodiment, there is an advantage that control over the manufacturing process can be facilitated since a part below a contact hole is entirely formed of a metal and thereby a large selection ratio of etching can be assured at a step of forming the contact hole in the interlayer insulating film.

Furthermore, although there is no description about the contact hole, a self-aligned contact can be also formed. Since an area of the element can be reduced when the self-aligned contact is used, a degree of integration can be improved. Moreover, although there is no description as to formation of a metal layer for wiring lines in this embodiment, a metal such as Cu (copper) can be used. In particular, since Cu has a low resistivity, low-resistance wiring lines can be realized.

SECOND EMBODIMENT

Figure 17:
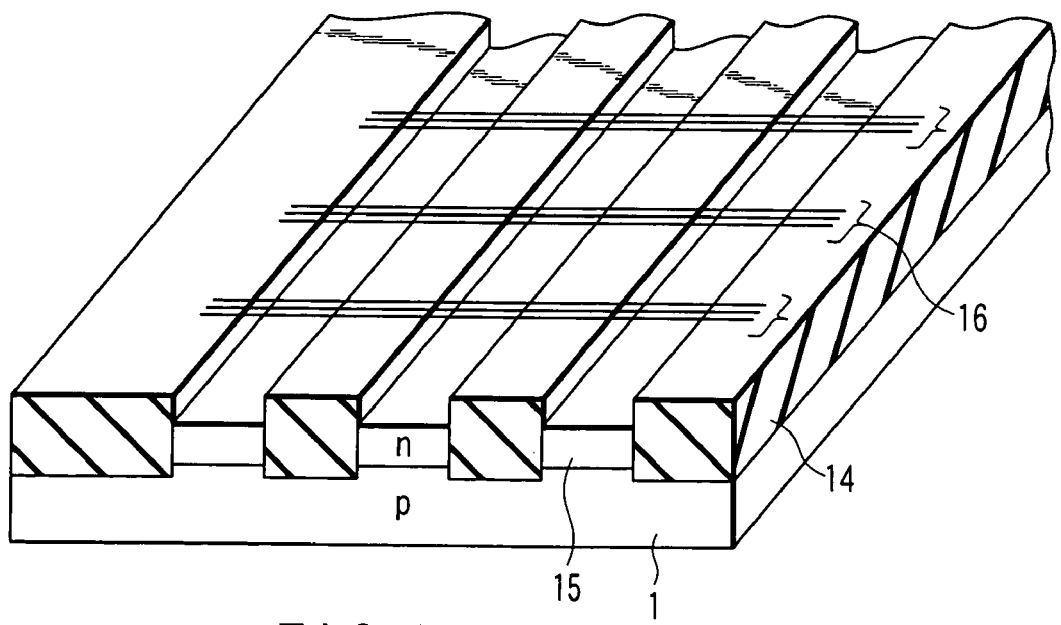
FIG. 17 is a schematic perspective view illustrating a semiconductor memory device according to a second embodiment.

A second embodiment of a semiconductor device according to the present invention will now be described. FIG. 17 shows a semiconductor (memory) device according to this embodiment. As different from the semiconductor memory device according to the first embodiment, this semiconductor memory device is characterized in that a wiring line group 15 made of a semiconductor is formed to be embedded in a substrate and a wiring line group 16 made of a metal is formed thereon.

Furthermore, in this semiconductor memory device, an insulator layer 14 consisting of, e.g., silicon oxide is formed on a semiconductor substrate 1, and the wiring line group 15 made of a semiconductor is formed to be held by the insulator layer 14. The wiring line group 16 made of a metal is formed on the wiring line group 15 made of a semiconductor with a gap therebetween. It is to be noted that an interlayer insulating film, an external wiring line, a junction region with the external wiring line and others are eliminated in this drawing.

Figure 18:
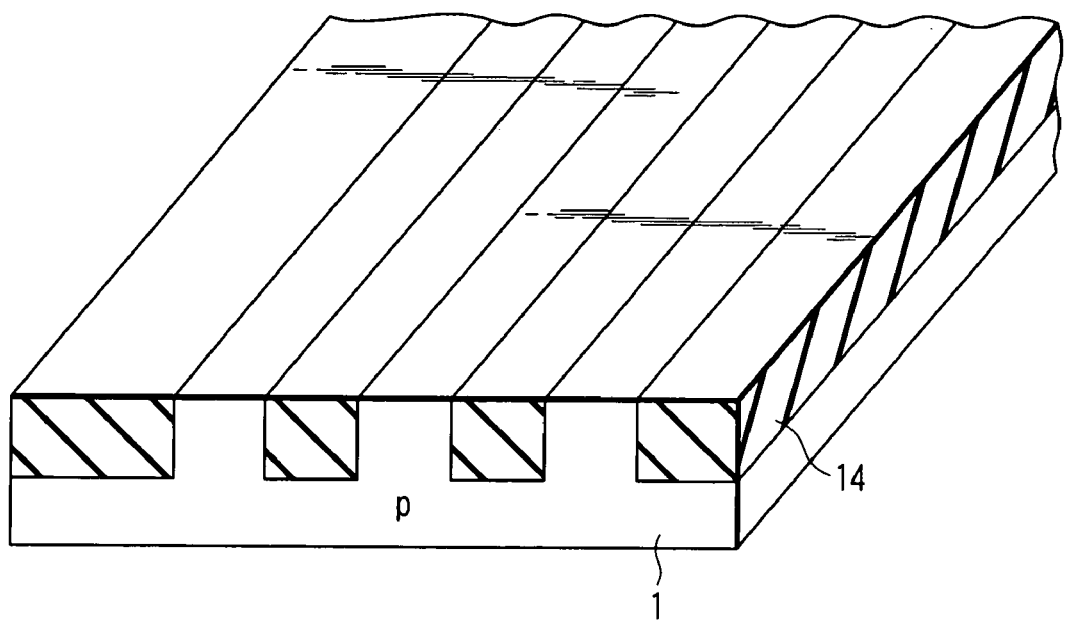
FIGS. 18 to 21 are schematic perspective views illustrating manufacturing steps of the semiconductor memory device according to the second embodiment in stages.

A manufacturing method of this semiconductor memory device will now be described hereinafter. First, as shown in FIG. 18, a surface of, e.g., a p-type semiconductor substrate 1 is subjected to anisotropic etching such as an RIE method to form grooves, and an insulator such as silicon oxide is filled in the grooves, thereby forming a silicon oxide layer 14.

Figure 19:
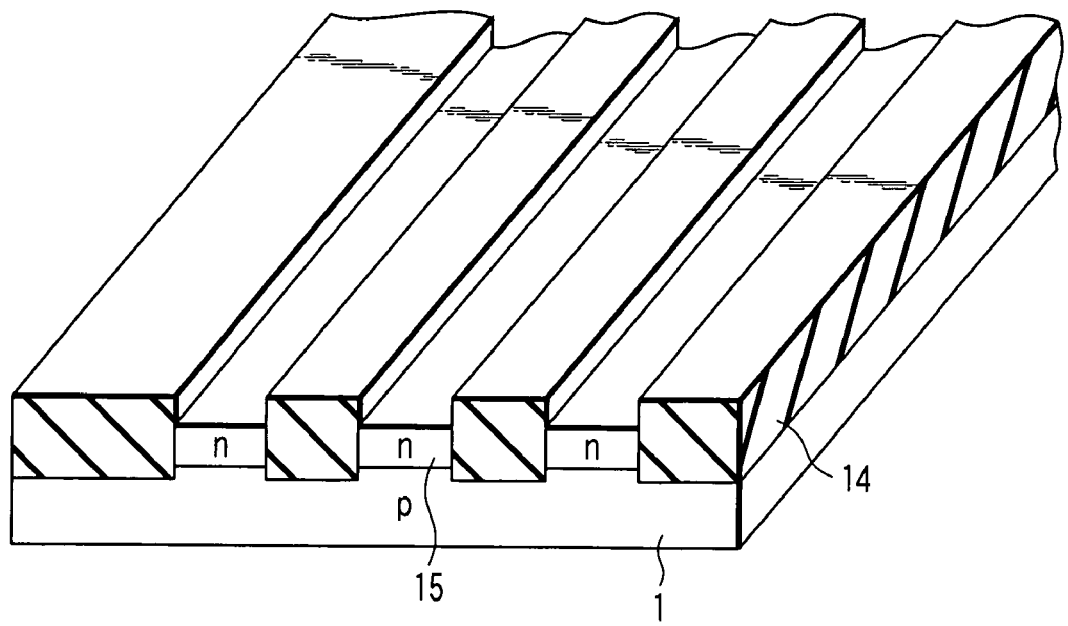

Then, as shown in FIG. 19, for example, an As ion is accelerated to have an energy of, e.g., 50 keV, and implanted into the semiconductor substrate 1 at a concentration of, e.g., $5 \times 10^{15}$ cm$^2$. Furthermore, a thermal process is applied at, e.g., 1050° C. for 30 seconds to form an n-type region. Subsequently, the surface of the semiconductor substrate is etched, e.g., 20 nm by using a method such as RIE. Then, a semiconductor layer having a thickness of, e.g., 10 nm is formed on a surface of the n-type region by a method such as epitaxial growth. Although this semiconductor layer ideally does not contain an impurity, it is in contact with an n-type layer formed by As ion implantation, and hence a majority carrier is an electron. In this manner, the wiring line group 15 consisting of the semiconductor is formed.

Figure 20:
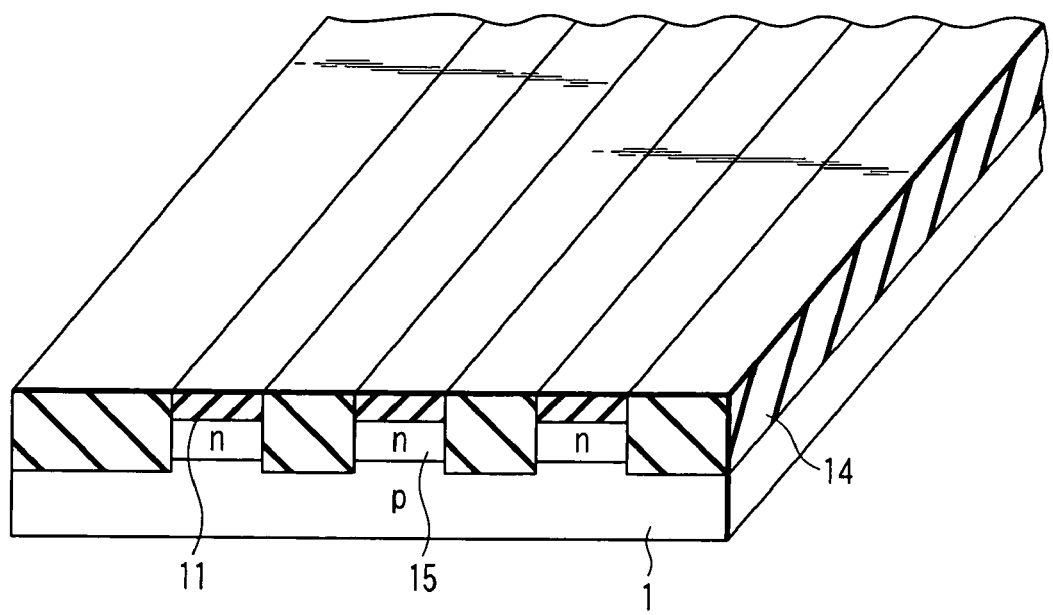

Then, as shown in FIG. 20, a silicon nitride film 11 having a thickness of, e.g., 20 nm is deposited by a method such as CVD. Subsequently, the surface is flattened by using a method such as CMP to expose the surface of the silicon oxide layer 14, thus forming the silicon nitride film 11 which serves as a sacrificial layer.

Figure 21:
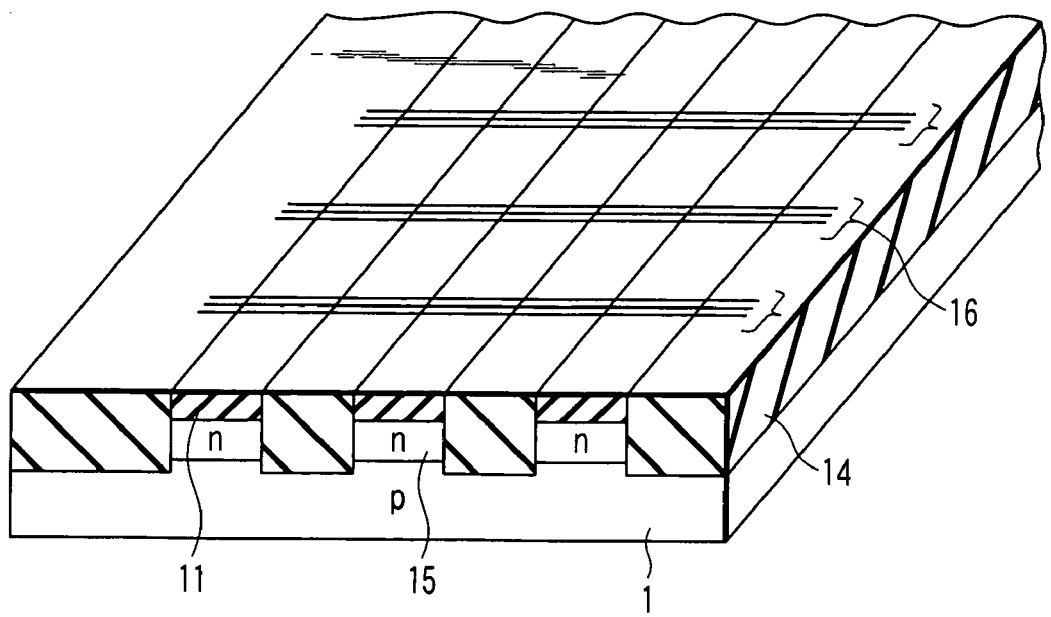

Then, as shown in FIG. 21, for example, a metal carbon nanotube film is formed on the entire surface of the semiconductor substrate 1 by a method such as a spin coat method. Moreover, a part of the carbon nanotube film is selectively removed to form the wiring line group 16.

Thereafter, like the manufacturing process of the first embodiment, an upper electrode formation step required to switch a cell from a conductive state to a non-conductive state is performed, and an interlayer insulating film formation step, a wiring line step and others are carried out like the prior art, thereby forming the non-volatile semiconductor memory device according to this embodiment shown in FIG. 17.

In this embodiment, different from the semiconductor memory device described in conjunction with the first embodiment, the wiring line group made of a metal is formed of carbon nanotubes, and the wiring line group made of a semiconductor is formed in the substrate. When the wiring line group made of a semiconductor is formed in the substrate, a cross-sectional area can be increased, and an impurity can be contained at a high concentration in a region other than a region where each junction with the wiring line group made of a metal is formed. Therefore, there is an advantage that the resistance of the wiring line group made of a semiconductor can be reduced, and the operating speed of the semiconductor memory device is consequently increased.

In this embodiment, although the wiring line group made of a metal is formed by using the metal carbon nanotube, this is not essential, and any other metal may be used to form the wiring line group. However, since the carbon nanotube has high mechanical strength, it is effective to use the carbon nanotube in a mechanical movable region like the semiconductor device according to the present invention.

In order to realize a high current value in the conducive state of a cell, as described above in conjunction with the first embodiment, it is preferable for a work function of a metal forming the wiring line group 16 made of a metal to be smaller than a difference between a forbidden gap center of the wiring line group 15 made of a semiconductor and a vacuum level of an electron when a majority carrier of the wiring line group 15 made of a semiconductor is the electron, and larger than the difference between the forbidden gap center of the wiring line group 15 made of a semiconductor and the vacuum level of the electron when the majority carrier of the wiring line group consisting of the semiconductor is a hole.

Although there is no description about the junction portion of the wiring line group 15 made of a semiconductor and the wiring line metal in this embodiment, this junction must be substantially provided as an ohmic junction. Therefore, in the vicinity of the junction portion with the wiring line metal alone, a V-group impurity such as As must be added and implanted, or a wiring line hole must be formed to pierce a region which is formed with a low impurity concentration in the vicinity of the surface.

Additionally, although the wiring line group 15 made of a semiconductor is of the n type in this embodiment, this is not essential, and it may be of a p type. Various modifications such as those described in the first embodiment can be carried out in this embodiment, and the same effects can be obtained.

THIRD EMBODIMENT

Figure 22:
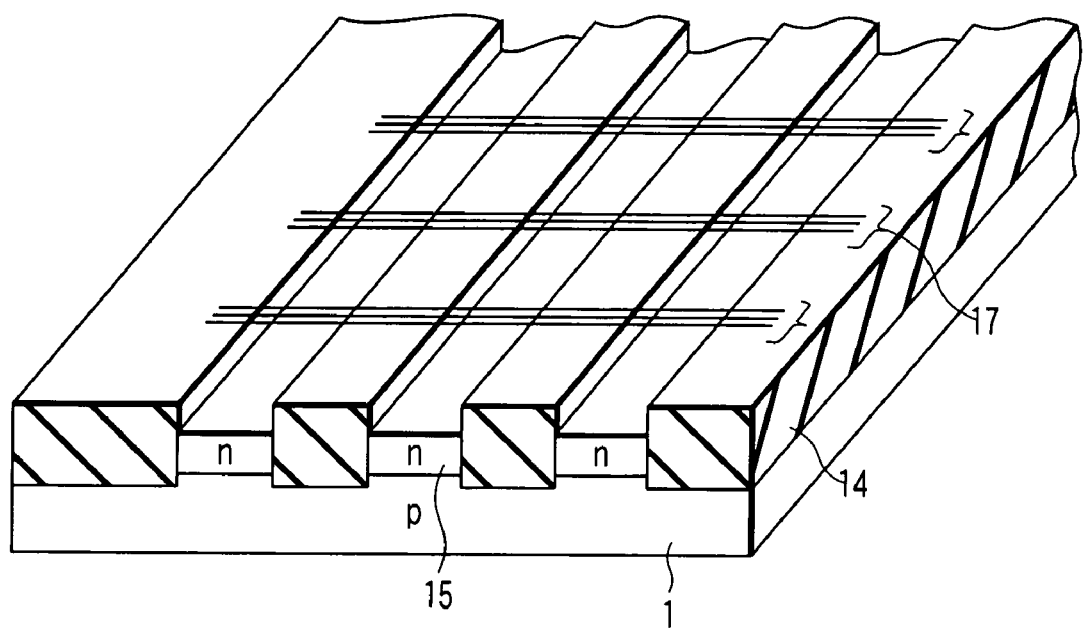
FIG. 22 is a schematic perspective view illustrating a semiconductor memory device according to a third embodiment of the present invention.

A third embodiment of a semiconductor device according to the present invention will now be described. FIG. 22 shows a semiconductor (memory) device according to this embodiment. This semiconductor memory device is different from the semiconductor memory devices described in conjunction with the first embodiment and the second embodiment, and characterized in that a wiring line group 15 is formed to be embedded in a substrate and a wiring line group 17 made of a semiconductor which is of a conductivity type opposite to that of the wiring line group 15 is formed on the wiring line group 15.

Further, in this semiconductor memory device, an insulator layer 14 formed of, e.g., silicon oxide is formed on the semiconductor substrate 1, and the wiring line group 15 made of a semiconductor is formed to be held by the insulator layer 14. The wiring line group 17 made of a semiconductor which is of a conductivity type opposite to that of the wiring line group 15 is formed on the wiring line group 15 made of a semiconductor with a gap therebetween. It is to be noted that an interlayer insulating film, an external wiring line, a junction region with the external wiring line and others are eliminated in this drawing.

Figure 23:
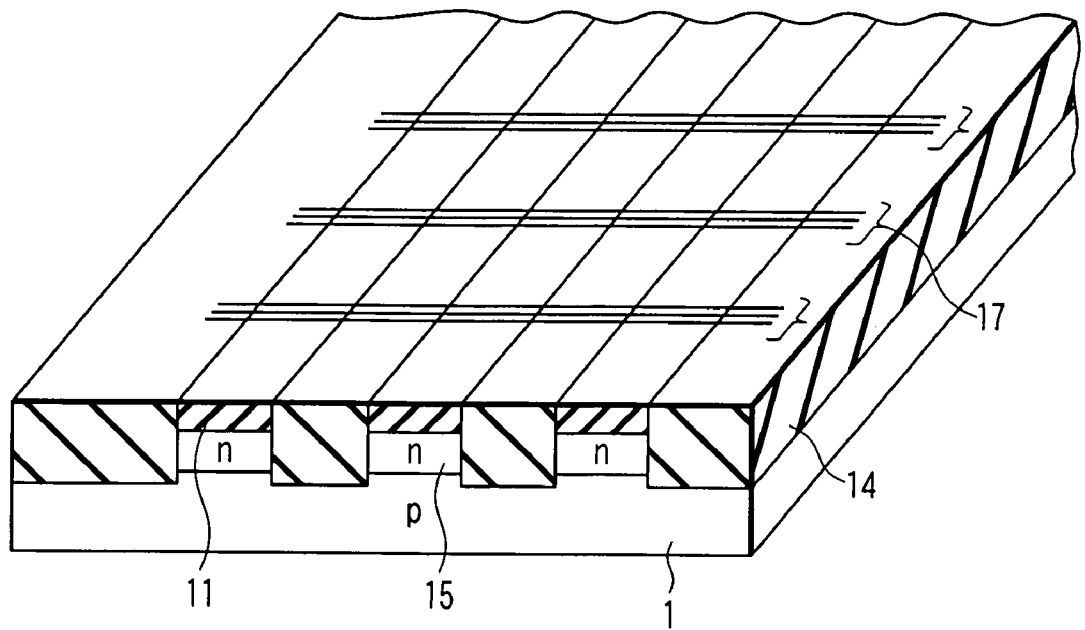
FIG. 23 is a schematic perspective view illustrating a manufacturing step of the semiconductor device according to the third embodiment.

A manufacturing method of this semiconductor memory device will now be described hereinafter. Following a step depicted in FIG. 20 of the second embodiment, as shown in FIG. 23, a p-type silicon thin line film having a diameter of, e.g., 2 nm is formed on an entire surface of the semiconductor substrate 1 by a method such as a CVD method. Furthermore, a part of the silicon thin line is selectively removed to form the wiring line group 17.

Thereafter, like the manufacturing process of the first embodiment, a step of forming an upper electrode which is used to switch a cell from a conductive state to a non-conductive state is performed, and an interlayer insulating film formation step, a wiring line step and others are carried out like the prior art, thereby forming the non-volatile semiconductor memory device according to the present invention shown in FIG. 22.

In this embodiment, different from the semiconductor memory devices described in conjunction with the first embodiment and the second embodiment, the wiring line group 15 made of a semiconductor is formed to be embedded in the substrate, and the wiring line group 17 made of a semiconductor which is of a conductivity type opposite to that of the wiring line group 15 is formed on the wiring line group 15. With such a configuration, a junction of the wiring line group 15 and the wiring line group 17 becomes a pn junction in the conductive state, thus showing rectification characteristics. Therefore, an element which is equivalent to series connection of an element which stores information and a rectification element can be realized by using only an element which store information based on switching between the conductive state and the non-conductive state.

In this case, in view of increasing a forward current at the junction of the wiring line group 15 and the wiring line group 17, it is preferable for work functions of the wiring line group 15 and a metal joined to the wiring line group 17 to be smaller than a difference between a forbidden gap center of a semiconductor region and a vacuum level of an electron when a majority carrier of the joined semiconductor region is an electron, and larger than the difference between the forbidden gap center of the semiconductor region and the vacuum level of the electron when the majority carrier of the joined semiconductor region is a hole.

In this embodiment, although the wiring line group 15 made of a semiconductor formed to be embedded in the substrate is of an n type and the wiring line group 17 made of a semiconductor formed on the wiring line group 15 is of a p type, this is not essential, and the wiring line group 15 made of a semiconductor formed to be embedded in the substrate may be of the p type and the wiring line group 17 made of a semiconductor provided on the wiring line group 15 may be of the n type.

Moreover, although the wiring line group made of a semiconductor provided on the substrate is formed of the silicon thin lines in this embodiment, this is not essential, and the wiring line group may be formed of, e.g., a silicon thin film or any other semiconductor. This embodiment can be modified in many ways like the foregoing embodiments, and the same effects can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first wiring line group including a plurality of first wiring lines, the first wiring lines being made of a metal and arranged in parallel with each other;
a second wiring line group including a plurality of second wiring lines, the second wiring lines being made of a semiconductor, crossing the first wiring line group, being arranged in parallel with each other and movable in the vicinity of each intersection with the first wiring lines of the first wiring line group; and
a plurality of metal regions joined with the wiring lines constituting the second wiring line group, and have a work function different from that of the metal forming the first wiring line group, the plurality of metal regions forming ohmic contacts with the second wiring lines,
wherein a junction of the one of the second wiring lines and the one of the first wiring lines forms a Schottky contact.

2. The semiconductor device according to claim 1, wherein a majority carrier of the semiconductor constituting the second wiring line group is an electron, both work functions of the first wiring line group and the plurality of metal regions are smaller than a difference between a forbidden gap center at a junction face of the semiconductor constituting the second wiring line group with the metal regions and a vacuum level of the electron, and at least one of the work functions is larger than a difference between a lower end of a conduction band at the junction face of the semiconductor constituting the second wiring line group with the metal regions and the vacuum level of the electron.

3. The semiconductor device according to claim 1, wherein a majority carrier of the semiconductor constituting the second wiring line group is a hole, both work functions of the metals constituting the first wiring line group and the metal regions are larger than a difference between a forbidden gap center at a junction face of the semiconductor constituting the second wiring line group with the metal regions and a vacuum level of an electron, and at least one of the work functions is smaller than a difference between an upper end of a valence band at the junction face of the semiconductor constituting the second wiring line group with the metal regions and the vacuum level of the electron.

4. The semiconductor device according to claim 2, wherein the work function of the metal constituting the metal regions is smaller than a difference between the lower end of the conduction band at the junction face of the semiconductor constituting the second wiring line group with the metal regions and the vacuum level of the electron, and the work function of the metal constituting the first wiring line group is larger than the difference between the lower end of the conduction band at the junction face of the semiconductor constituting the second wiring line group with the metal regions and the vacuum level of the electron.

5. The semiconductor device according to claim 3, wherein the work function of the metal constituting the first wiring line group is smaller than the difference between the upper end of the valence band at the junction face of the semiconductor constituting the second wiring line group with the metal regions and the vacuum level of the electron, and the work function of the metal regions is larger than the difference between the upper end of the valence band at the junction face of the semiconductor constituting the second wiring line group with the metal regions and the vacuum level of the electron.

6. The semiconductor device according to claim 4, wherein the second wiring line group contains carbon, and the metal constituting the metal regions includes one selected from the group consisting of Ca, Ce, Cs, Eu, Gd, Hf, K, Li, Lu, Mg, Mn, Na, Nd, Rb, Sc, Sm, Sr, Tb, Th, TI, U, Y and Zr.

7. The semiconductor device according to claim 4, wherein the second wiring line group contains carbon, and the metal constituting the metal regions includes one selected from the group consisting of Ce, Gd, Lu, Nd, Tb and Y.

8. The semiconductor device according to claim 5, wherein the second wiring line group contains carbon, and the metal forming the metal regions includes one selected from the group consisting of Ag, Au, Be, Co, Cu, Fe, Ir, Mo, Ni, Os, Pd, Pt, Re, Rh, Ru, Sb, Ta, W and Zn.

9. The semiconductor device according to claim 5, wherein the second wiring line group contains carbon, and the metal forming the metal regions includes one selected from the group consisting of Co, Fe, Ni, Pd, Pt and Rh.

10. A semiconductor device comprising:
a first wiring line group including a plurality of first wiring lines, the first wiring lines being made of a metal and arranged in parallel with each other; and
a second wiring line group including a plurality of second wiring lines, the second wiring lines crossing the first wiring line group, being arranged in parallel with each other, each of the second wiring lines having a movable semiconductor region in the vicinity of each intersection with the first wiring lines of the first wiring line group and having a metal region with a work function different from that of the metal constituting the first wiring line group in an area other than the intersections, the metal region forming an ohmic contact with the second wiring lines in the area other than the intersections,
wherein a junction of the one of the second wiring lines and the one of the first wiring lines forms a Schottky contact.

11. The semiconductor device according to claim 10, wherein a majority carrier of the semiconductor region in the second wiring line group is an electron, both work functions of the first wiring line group and the metal region of the second wiring line group are smaller than a difference between a forbidden gap center at a junction face of the semiconductor region in the second wiring line group with the metal or the metal region and a vacuum level of the electron, and at least one of the work functions is larger than a difference between a lower end of a conduction band at the junction face of the semiconductor constituting the second wiring line group and the vacuum level of the electron.

12. The semiconductor device according to claim 10, wherein a majority carrier of the semiconductor region in the second wiring line group is a hole, both work functions of the first wiring line group and the metal region of the second wiring line group are larger than a difference between a forbidden gap center at a junction face of the semiconductor region in the second wiring line group with the metal or the metal region and a vacuum level of an electron, and at least one of the work functions is smaller than a difference between an upper end of a valence band at the junction face of the semiconductor constituting the second wiring line group and the vacuum level of the electron.

13. The semiconductor device according to claim 11, wherein the second wiring line group contains carbon, and the metal forming the metal region of the second wiring line group includes one selected from the group consisting of Ca, Ce, Cs, Eu, Gd, Hf, K, Li, Lu, Mg, Mn, Na, Nd, Rb, Sc, Sm, Sr, Tb, Th, TI, U, Y and Zr.

14. The semiconductor device according to claim 12, wherein the second wiring line group contains carbon, and the metal constituting the metal region of the second wiring line group includes one selected from the group consisting of Ag, Au, Be, Co, Cu, Fe, Ir, Mo, Ni, Os, Pd, Pt, Re, Rh, Ru, Sb, Ta, W and Zn.

* * * * *